(12) United States Patent
Lee et al.

(10) Patent No.: US 7,525,858 B2
(45) Date of Patent: Apr. 28, 2009

(54) SEMICONDUCTOR MEMORY DEVICE HAVING LOCAL SENSE AMPLIFIER

(75) Inventors: Chan-Yong Lee, Suwon-si (KR); Chi-Wook Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 156 days.

(21) Appl. No.: 11/605,974

(22) Filed: Nov. 30, 2006

(65) Prior Publication Data

US 2007/0280020 A1   Dec. 6, 2007

(30) Foreign Application Priority Data

May 25, 2006   (KR) .................. 10-2006-0046868

(51) Int. Cl.
*G11C 7/00* (2006.01)
(52) U.S. Cl. .................. 365/205; 365/63; 365/189.15
(58) Field of Classification Search ............. 365/63, 365/189.15, 205
See application file for complete search history.

(56) References Cited

U.S. PATENT DOCUMENTS

| | | | |
|---|---|---|---|
| 5,283,760 A * | 2/1994 | Chin et al. ............. | 365/189.17 |
| 6,333,884 B1 * | 12/2001 | Kato et al. .................. | 365/208 |
| 7,184,347 B2 * | 2/2007 | Lee et al. ..................... | 365/207 |
| 7,193,913 B2 * | 3/2007 | Kim ........................... | 365/205 |
| 7,236,414 B2 * | 6/2007 | Lee ............................. | 365/205 |
| 2002/0071302 A1 | 6/2002 | Kawasumi | |
| 2004/0052141 A1 | 3/2004 | McAdams et al. | |
| 2006/0028888 A1 * | 2/2006 | Shin et al. .................... | 365/205 |

* cited by examiner

*Primary Examiner*—Hoai V Ho
(74) *Attorney, Agent, or Firm*—Volentine & Whitt, PLLC (57) ABSTRACT

A semiconductor memory device comprises a local sense amplifier connected between a bit line sense amplifier and a current sensing type input/output (IO) sense amplifier. The bit line sense amplifier is connected between a bit line pair, the bit line pair is connected to a local data IO pair, and the local data IO pair is connected to a global data IO pair via a pair of switching circuits. During a read operation of the semiconductor memory device, the local data IO pair remains connected to the global data IO pair.

19 Claims, 8 Drawing Sheets

SEMICONDUCTOR MEMORY DEVICE HAVING LOCAL SENSE AMPLIFIER

BACKGROUND OF THE INVENTION

1. Field of the Invention

Embodiments of the invention relate generally to semiconductor memory devices. More particularly, embodiments of the invention relate to volatile semiconductor memory devices having a local sense amplifier.

A claim of priority is made to Korean Patent Application No. 10-2006-0046868, filed on May 25, 2006, the disclosure of which is hereby incorporated by reference in its entirety.

2. Description of Related Art

There is a continuing demand for volatile semiconductor memory devices such as dynamic random access memory (DRAM) to become increasingly integrated and to operate at higher clock speeds. Conventional DRAM devices are often used, for example, as main memories in electronic devices and therefore increasing their level of integration and speed tends to improve the performance of the electronic devices.

As the level of integration in volatile memory devices such as DRAMs continues to increase, the level of an operating voltage used to perform data access operations such as read and write operations in the devices tends to decrease accordingly. As the operating voltage of the devices decreases, a current difference between lines in data input/output (IO) line pairs of memory cells in the devices tends to decrease accordingly. As a result of this decrease in the current difference between the lines of the data IO line pairs, a sensing margin of the memory cells decreases as well.

To help explain some problems associated with the decreased sensing margin, examples of read and write operations for a conventional DRAM device are explained below.

A conventional DRAM device includes memory cells comprising an access transistor and a storage capacitor. To maintain stored data in the memory cells, a periodic refresh operation is generally required.

A read operation for a memory cell in the conventional DRAM device is typically performed using a method wherein a column selection gate opens and current flows through an IO line of a current sense amplifier associated with the memory cell and a bit line in a bit line pair maintained at a relatively low potential.

A resulting difference in the amount of current flowing through both lines in the bit line pair is then sensed to determine the logic state of the memory cell. Unfortunately, as the memory cell density of DRAMs increases and cell data is input and output at higher frequencies, the required sensing margin of a sense amplifier used to sense the current difference tends to decrease accordingly. As a result, it becomes increasingly difficult to accurately sense the logic state of the memory cell.

Figure 1:
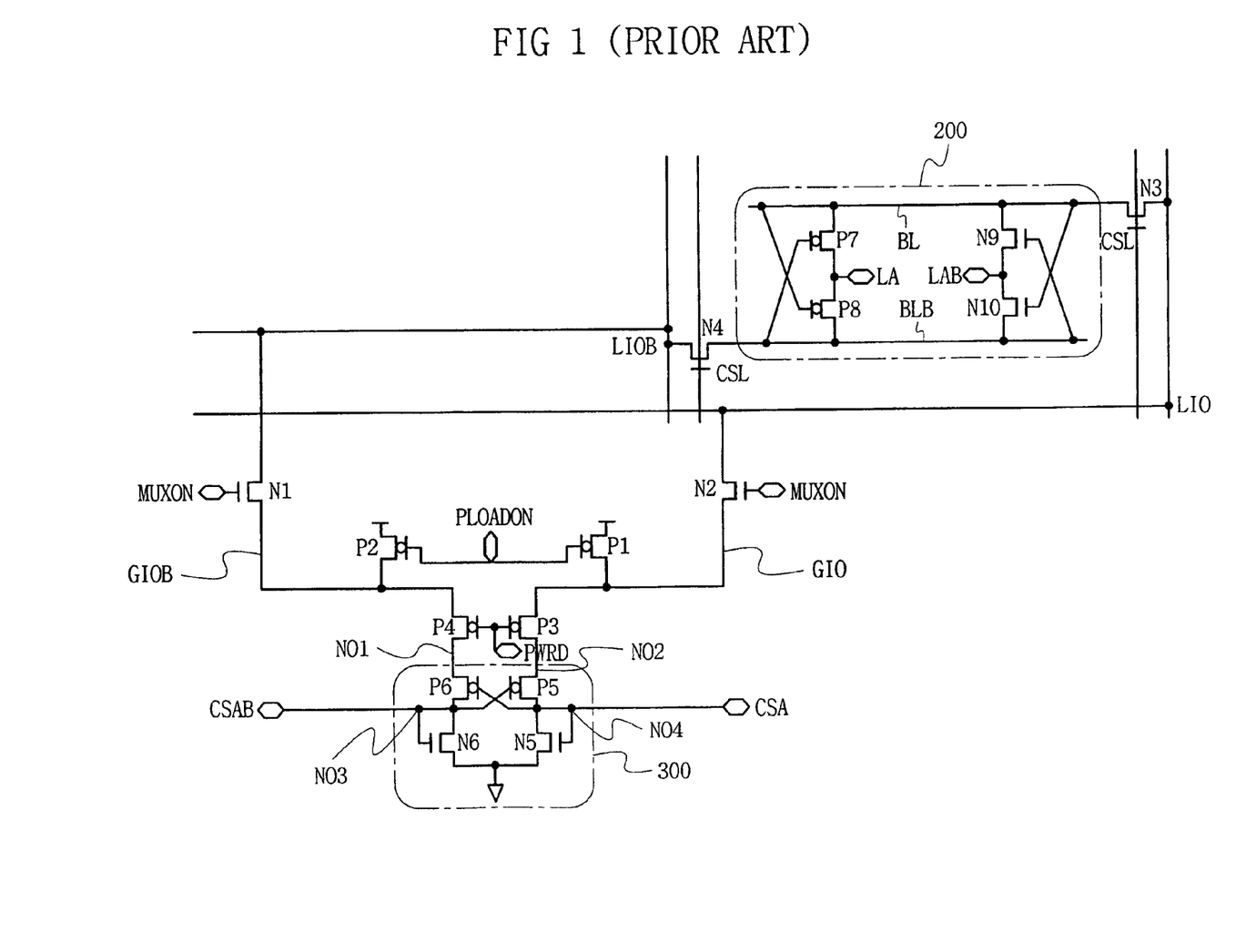
FIG. 1 is a circuit diagram of a conventional sense amplifier circuit for use in a semiconductor memory device.

FIG. 1 is a circuit diagram of a conventional sense amplifier circuit for use in a semiconductor memory device. Referring to FIG. 1, the sense amplifier circuit comprises a bit line sense amplifier (BLSA) 200 connected between a bit line pair comprising a bit line BL and a complementary bit line BLB. The sense amplifier circuit further comprises a current sense amplifier 300 connected between a global data IO line pair comprising a global data IO line GIO and a complementary global data IO line GIOB. Current sense amplifier 300 functions as an IO sense amplifier.

Memory cells are connected between corresponding bit lines among bit line pairs such as that illustrated in FIG. 1, and word lines (not shown), forming a matrix-type memory cell array. Bit line sense amplifier 200 includes a P-type portion comprising P-type metal-oxide semiconductor (MOS) transistors P7 and P8, and an N-type portion comprising N-type MOS transistors N9 and N10. Bit line sense amplifier 200 is connected to one or more bit line pairs associated with one or more memory cells.

In a read operation involving the sense amplifier circuit shown in FIG. 1, a column selection line CSL and a multiplexing signal MUXON are both activated (i.e., set to a voltage level "high"). As a result, a column selection gate comprising negative metal-oxide semiconductor (NMOS) transistors N3 and N4 is turned on, along with switching transistors N1 and N2. NMOS transistor N1 connects complementary local data IO line LIOB with complementary global data IO line GIOB, NMOS transistor N2 connects local data IO line LIO with global data IO line GIO, NMOS transistor N3 connects bit line BL with local data IO line LIO, and NMOS transistor N4 connects complementary bit line BLB with complementary local data IO line LIOB. Load transistors P1 and P2 are turned on by a load control signal PLOADON to supply current during the read operation.

During the read operation, P-type transistors P3 and P4 are turned on by a switching signal PWRD. Where bit lines BL and BLB have a voltage level difference during the read operation, current will flow through PMOS transistor P1 and bit line BL with a different magnitude than through PMOS transistor P2 and complementary bit line BLB. For example, where a memory cell connected to bit line BL stores data with a relatively low voltage level compared with complimentary bit line BLB, a relatively larger current will flow in a current path along PMOS transistor P1, global data IO line GIO, local data IO line LIO and bit line BL, than in a current path along PMOS transistor P2, complementary global data IO line GIOB, complementary local data IO line LIOB and complementary bit line BLB.

In this case, a different amount of current will flow through a sense input node NO2 and a sense input node NO1 of current sense amplifier 300. Current sense amplifier 300 is a cross coupled-type current amplifier comprising of PMOS transistors P5 and P6 and diode-coupled NMOS transistors N5 and N6. Current sense amplifier 300 senses and amplifies the difference in the amount of current flowing through sense input nodes NO1 and NO2 by operation of transistors P5, P6, N5 and N6. As a result, current sense data CSA and CSAB is produced at respective sense output nodes NO3 and NO4. Current sense data CSA and CSAB is input to a voltage sense amplifier (not shown), and the voltage sense amplifier produces one or more output signals indicative of the logic state of the memory cell.

As the density of DRAM devices increases and memory cell transistors become smaller, the difference in magnitude between current on bit line BL and complementary bit line BLB during read operations tends to decrease accordingly. Where the current difference becomes too small, current sense amplifier 300 may not be able to appropriately amplify the current difference and read operations may fail. In other words, current sense data CSA and CSAB may not be informative as to the logic state of a corresponding memory cell. To further illustrate this, a sensing failure is described below in relation to FIGS. 3 and 4.

Figure 3:
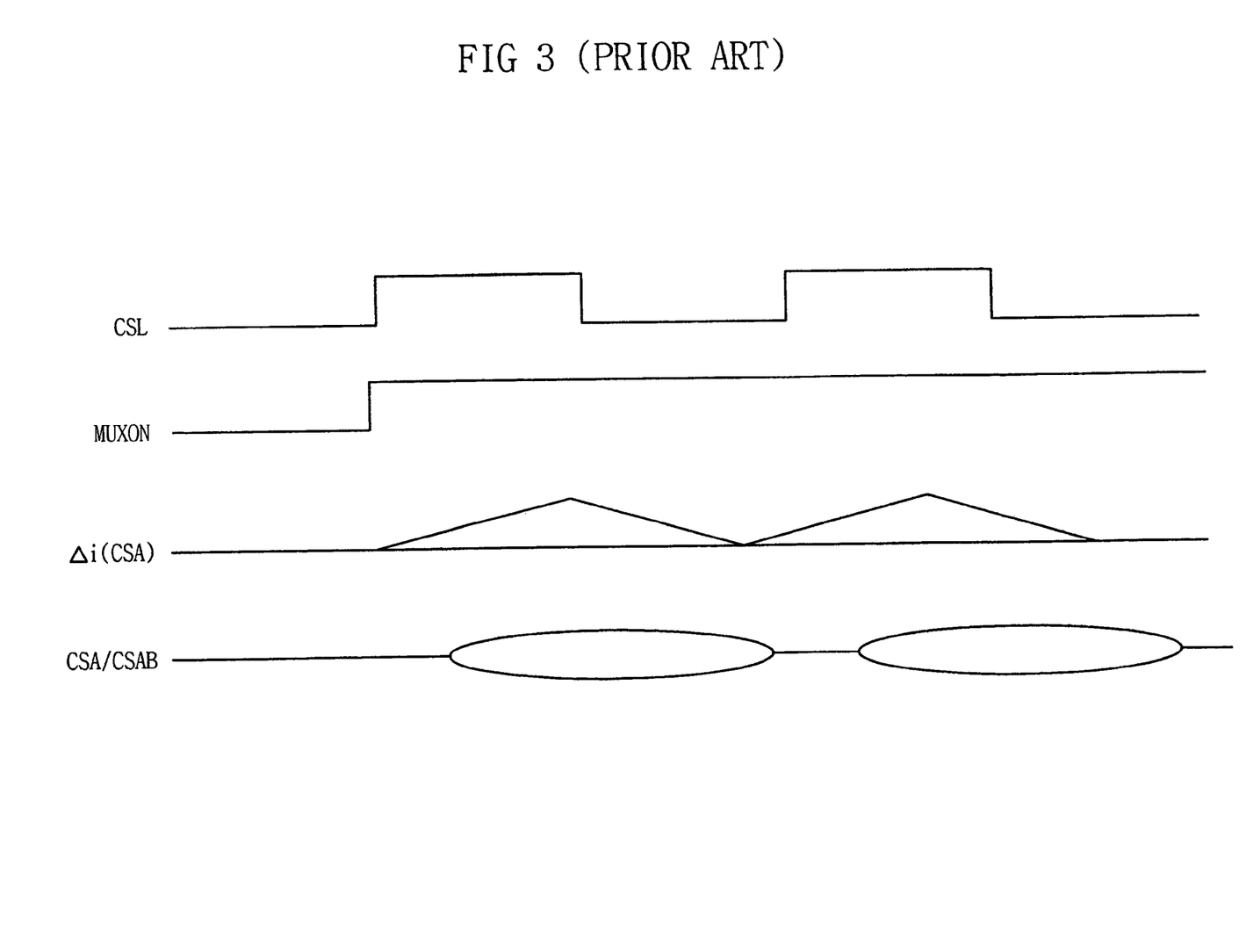
FIGS. 3 through 6 are timing diagrams illustrating the operation of the sense amplifier circuits illustrated in FIGS. 1 and 2.

Referring to FIG. 3, in a read operation of the sense amplifier circuit, column selection line CSL and multiplexing signal MUXON are activated. As a result, a current difference is generated between sense input nodes NO1 and NO2 of current sense amplifier 300. The current difference is illustrated in FIG. 3 by the waveform labeled Δi(CSA). Current sense amplifier 300 senses and amplifies the current difference between sense input nodes NO1 and NO2 to produce output signals having waveforms such as those labeled CSA/CSAB in FIG. 3 through two output nodes NO3 and NO4, respectively.

Figure 4:
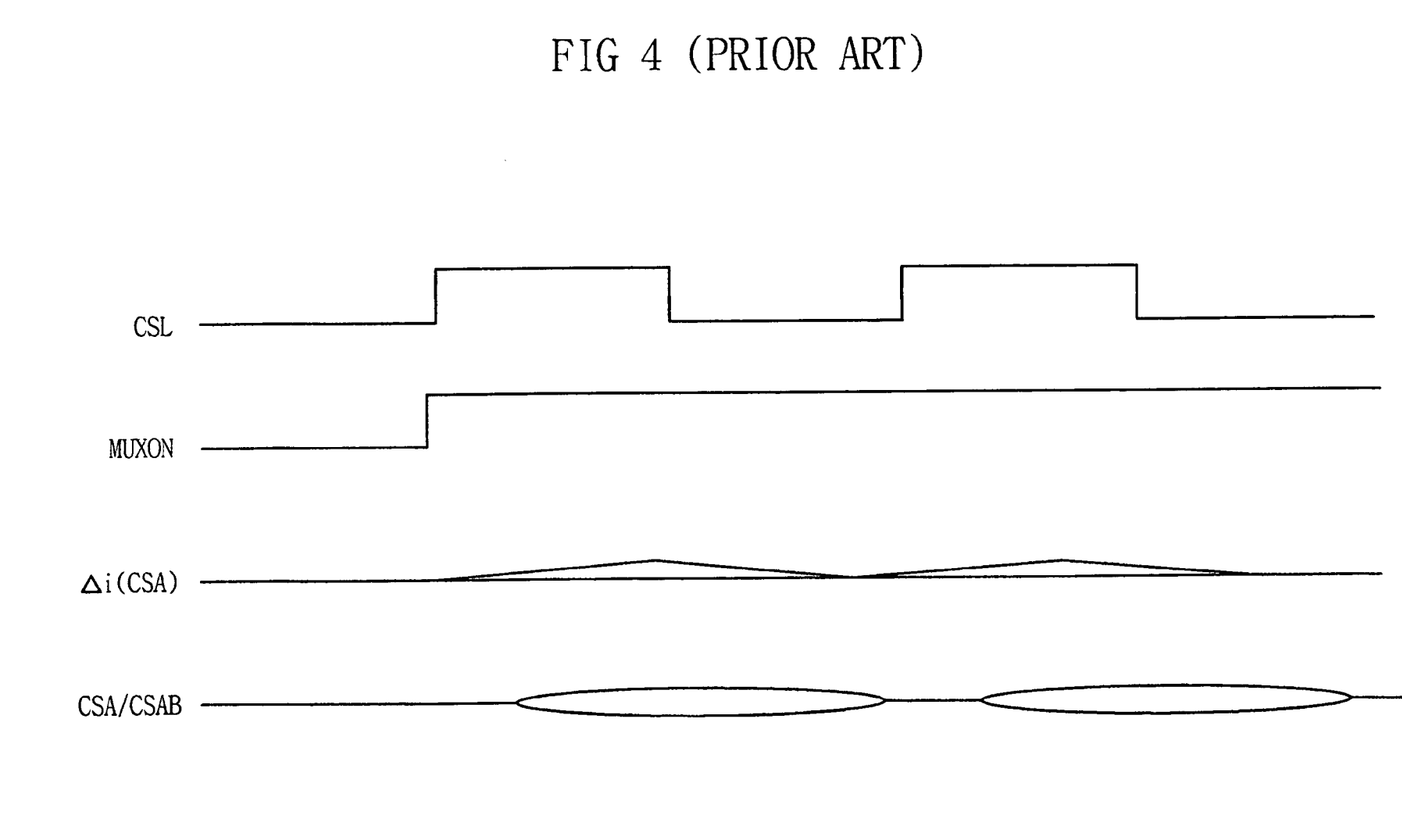

Unfortunately, as the density of memory cells increases and the resistance of IO lines increases (e.g., by decreasing line width), the current difference between sense input nodes NO1 and NO2 of current sense amplifier 300 tends to decrease accordingly, as illustrated by the waveform labeled Δi(CSA) in FIG. 4. As a result, the output signals apparent at output nodes NO3 and NO4 become attenuated, as illustrated by the waveform labeled CSA/CSAB in FIG. 4. The attenuation of the output signals apparent at output nodes NO3 and NO4 may cause a failure in the read operation. In addition, as the current difference between sense input nodes NO1 and NO2 decreases, minor mismatches between the MOS transistors forming current sense amplifier 300 due to manufacturing process variation may also give rise to failures in the read operation.

Figure 2:
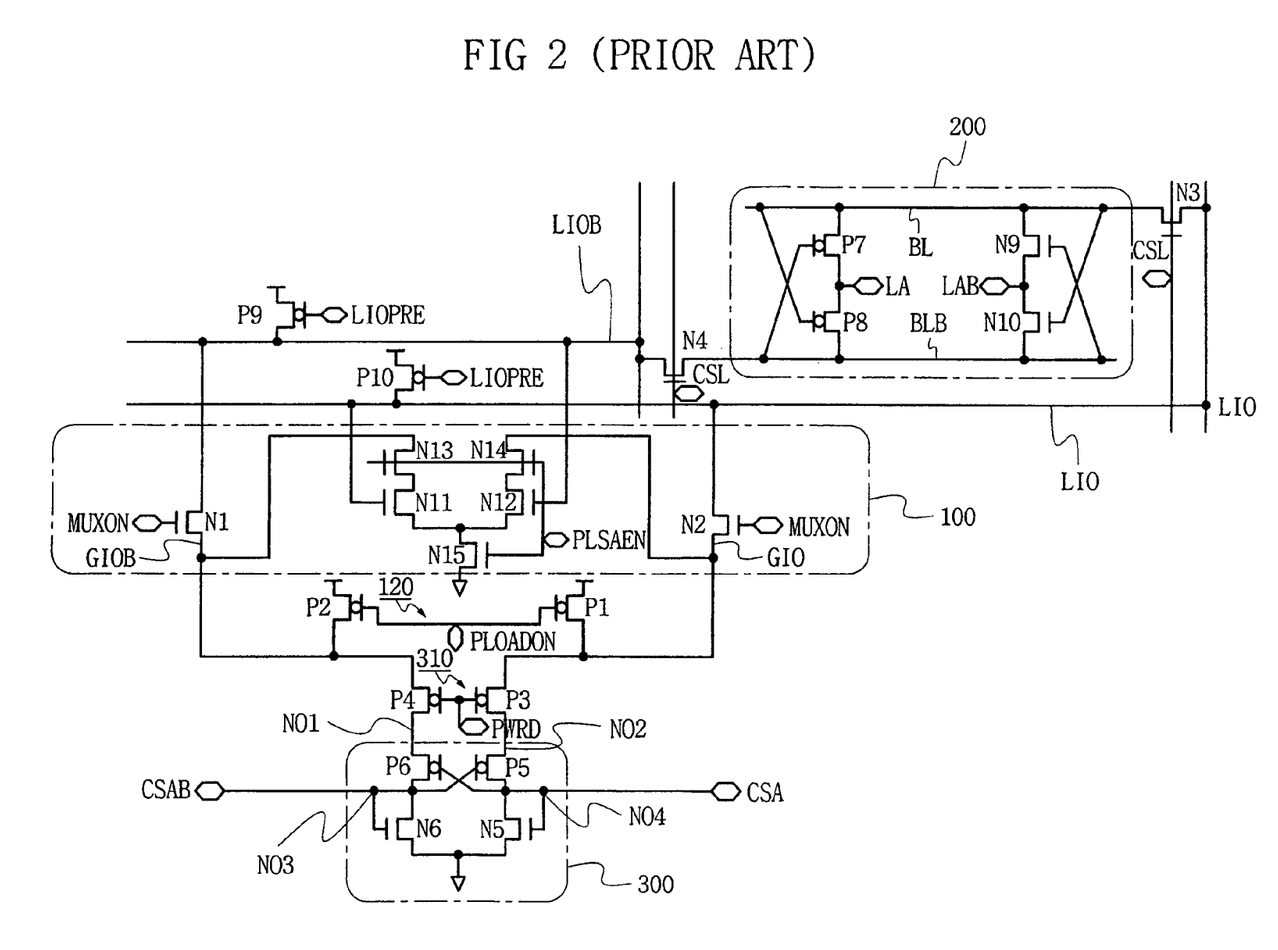
FIG. 2 is a circuit diagram of a conventional sense amplifier circuit including a local sense amplifier.
Figure 5:
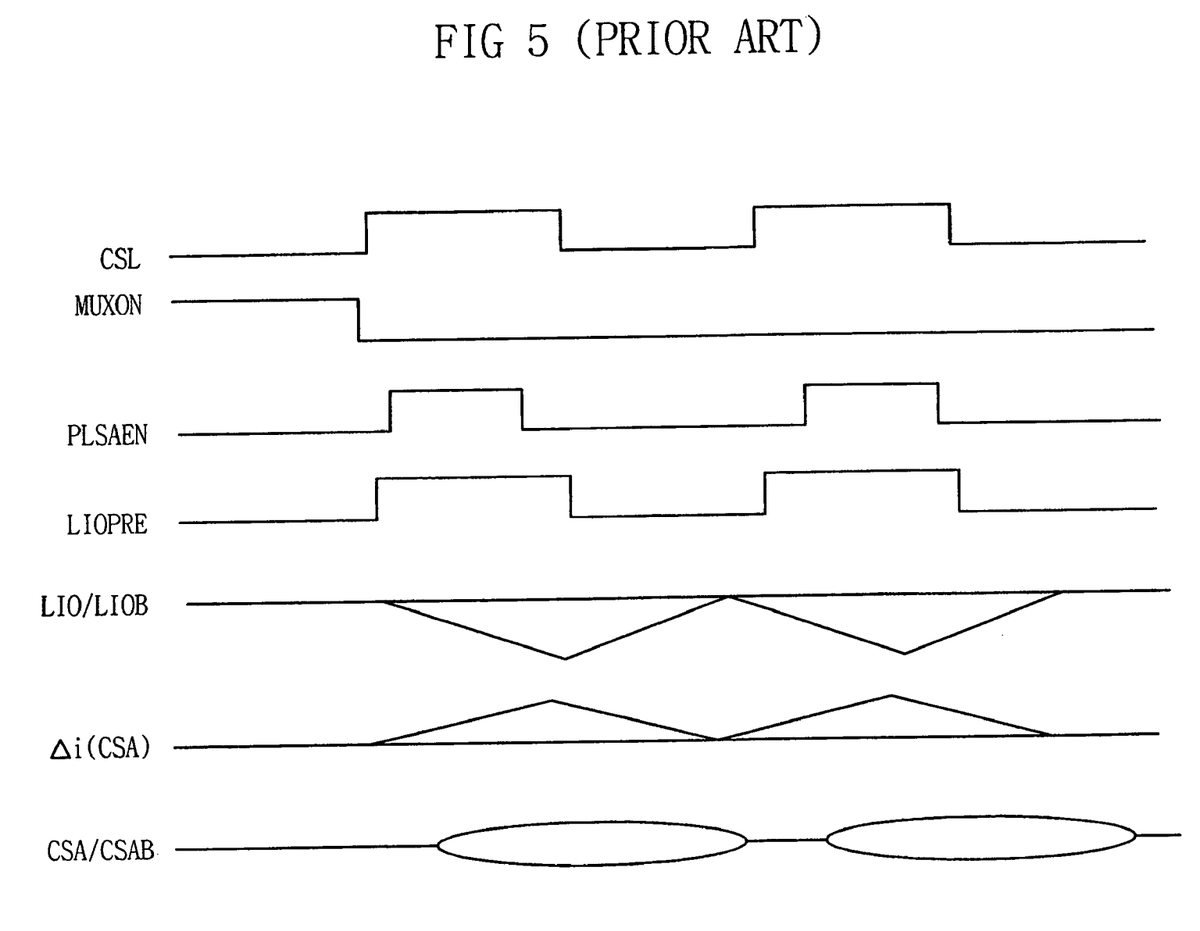
Figure 6:
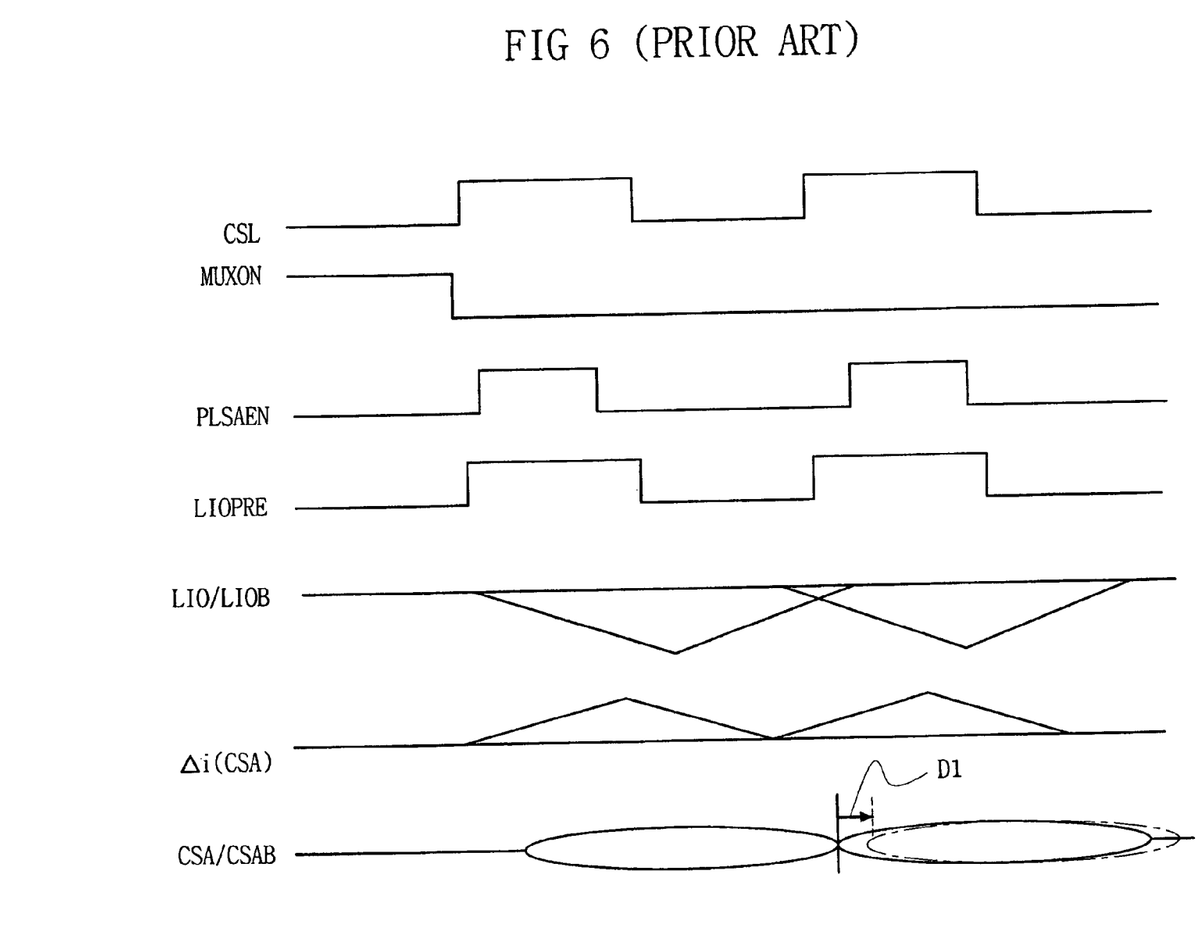

To prevent failures from occurring in read operations, some conventional sense amplifiers such as that illustrated in FIG. 2 include a local sense amplifier. FIG. 2 illustrates a conventional sense amplifier circuit having a local sense amplifier and FIGS. 5 and 6 illustrate the timing of a read operation performed with the sense amplifier circuit of FIG. 2.

Referring to FIG. 2, a differential amplifier type local sense amplifier 100 is installed between BLSA 200 and current sense amplifier 300 shown in FIG. 1. In addition, a precharge transistor P9 is connected to complementary local data IO line LIOB to precharge complementary local data IO line pair LIOB and a precharge transistor P10 is connected to local data IO line LIO to precharge local data IO line LIO.

Local sense amplifier 100 shown in FIG. 2 amplifies the current difference between the inputs of current sense amplifier 300. However, the benefits of local sense amplifier 100 may be lost when the sense amplifier circuit is operated at a high frequency.

A read operation of the sense amplifier circuit of FIG. 2 is described below with reference to FIGS. 5 and 6.

Referring to FIG. 5, in the read operation, column selection line CSL is activated while multiplexing signal MUXON is deactivated (i.e., set to a voltage level "low"). At the same time, a precharge signal LIOPRE is activated to precharge complementary local data IO line LIOB and local data IO line LIO, and a sense amplifier control signal PLSAEN is activated to enable local sense amplifier 100. When precharge signal LIOPRE is activated, a precharge operation of precharge transistors P9 and P10 stops. While switching transistors N1 and N2 are turned off, local sense amplifier 100 amplifies the difference between the respective voltage levels of complementary local data IO line LIOB and local data IO line LIO by operation of transistors N11 through N15.

In FIG. 5, the difference between the voltage levels of complementary local data IO line LIOB and local data IO line LIO is represented by the waveform labeled LIO/LIOB. This difference causes a corresponding change in the respective voltage levels of complementary global data IO line GIOB and global data IO line GIO, which in turn causes an increase in the current difference between sense input nodes NO1 and NO2 of current sense amplifier 300, as illustrated by the waveform labeled Δi(CSA) in FIG. 5. Current sense amplifier 300 senses and amplifies the current difference between sense input nodes NO1 and NO2 to produce output signals having waveforms such as those labeled CSA/CSAB in FIG. 5 through output nodes NO3 and NO4, respectively.

Unfortunately, in a high frequency operation, there may not be enough time to completely precharge complementary local data IO line LIOB and local data IO line LIO, and as a result, current sense amplifier 300 may have difficulty producing current sense data CSA and CSAB within a desired time frame. For example, as illustrated by the reference numeral D1 in FIG. 6, the output signals of the sense amplifier circuit fail to develop at the correct time during high-frequency operation.

In sum, in the sense amplifier circuit of FIG. 2, the voltage level of complementary local data IO line LIOB and local data IO line LIO is increased in order to increase the respective input currents of current sense amplifier 300. However, the performance of the sense amplifier circuit tends to suffer at high frequencies due at least in part to the difficulty of precharging complementary local data IO line LIOB and local data IO line LIO. Therefore, the sense amplifier circuit of FIG. 2 has limited applicability in highly integrated memories operating at high speeds.

SUMMARY OF THE INVENTION

Accordingly, selected embodiments of the invention provide semiconductor memory devices capable of performing a read operation without performing a precharge operation on local data IO lines. The semiconductor memory devices include a local sense amplifier adapted to perform reliably at high clock speeds. In addition, the local sense amplifier may be selectively enabled or disabled. Devices according to selected embodiments of the invention tend to reduce a sensing fail rate of memory cell read operations performed at high frequencies.

According to one embodiment of the invention, a semiconductor memory device comprises a bit line sense amplifier connected to a bit line and a complementary bit line, a first input/output (IO) line connected to the bit line via a first column select circuit and a first complementary IO line connected to the complementary bit line via a second column select circuit. The device further comprises a second IO line connected to the first IO line via a first switching circuit and a second complementary IO line connected to the first complementary IO line via a second switching circuit. The device still further comprises a first IO sense amplifier connected to the second IO line and the second complementary IO line, and a second IO sense amplifier connected between the first IO line and the second IO line and between the first complementary IO line and the second complementary IO line and adapted to operate in response to a sense amplifier control signal. The second IO sense amplifier operates to amplify a difference between a voltage apparent on the first IO line and a voltage apparent on the first complementary IO line while the first and second switching circuits are turned on such that a difference between a current in the second IO line and a current in the second complementary IO line is amplified.

According to another embodiment of the invention, a semiconductor memory device comprises a bit line sense amplifier connected between a bit line and a complementary bit line, a current sensing type input/output (IO) sense amplifier connected to a global data IO line and a complementary global data IO line. The device further comprises a local sense amplifier connected between the bit line sense amplifier and the current sensing type IO sense amplifier through a local data IO line and a complementary local data IO line. The local data IO line is connected at one end to the bit line and at another end to the global data IO line through a first switching circuit, and the complementary local data IO line is connected at one end to the complementary bit line and at another end to the complementary global data IO line through a second switching circuit. The device further comprises an option unit adapted to selectively enable the local sense amplifier while the first and second switching circuits are turned on such that the local sense amplifier amplifies a difference between a current in the local data IO line and a current in the complementary IO line.

According to still another embodiment of the invention, a method of controlling a semiconductor device is provided. The device comprises a bit line sense amplifier connected between a bit line and a complementary bit line, a current sensing type input/output (IO) sense amplifier connected to a global data IO line and a complementary global data IO line, and a local sense amplifier connected between the bit line sense amplifier and the current sensing type IO sense amplifier through a local data IO line and a complementary local data IO line, wherein the local data IO line is connected at one end to the bit line and at another end to the global data IO line through a first switching circuit, and the complementary local data IO line is connected at one end to the complementary bit line and at another end to the complementary global data IO line through a second switching circuit. The method comprises operationally connecting the local data IO line to the global data IO line and the complementary local data IO line to the complementary global data IO line during a read operation by turning on the first and second switching circuits, and selectively enabling or disabling the local sense amplifier.

BRIEF DESCRIPTION OF THE DRAWINGS

Embodiments of the invention are described in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims.

Figure 7:
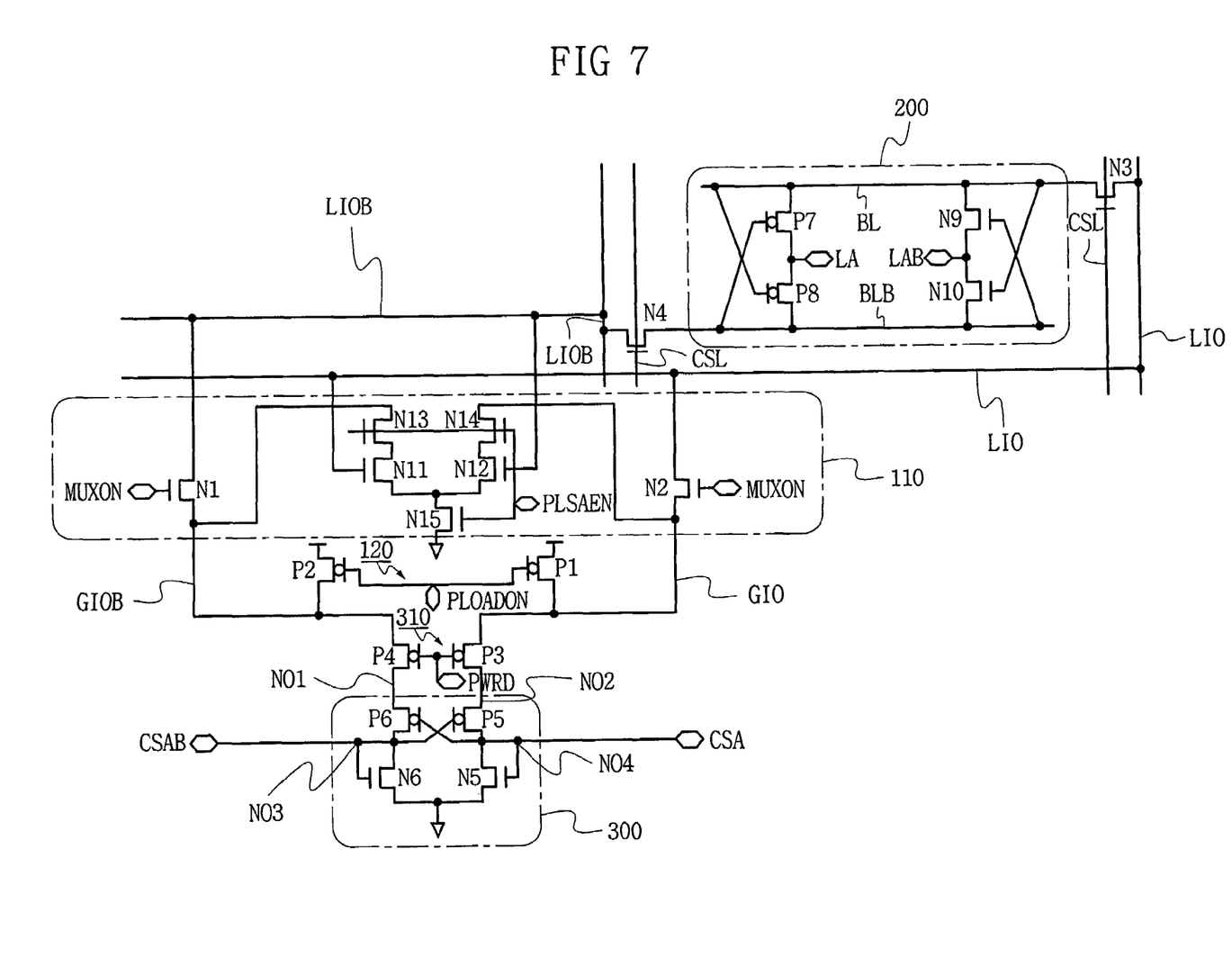
FIG. 7 is a circuit diagram of a sense amplifier circuit according to one embodiment of the invention; and, FIG. 8 is a timing diagram illustrating the operation of the sense amplifier circuit illustrated in FIG. 7.
Figure 8:
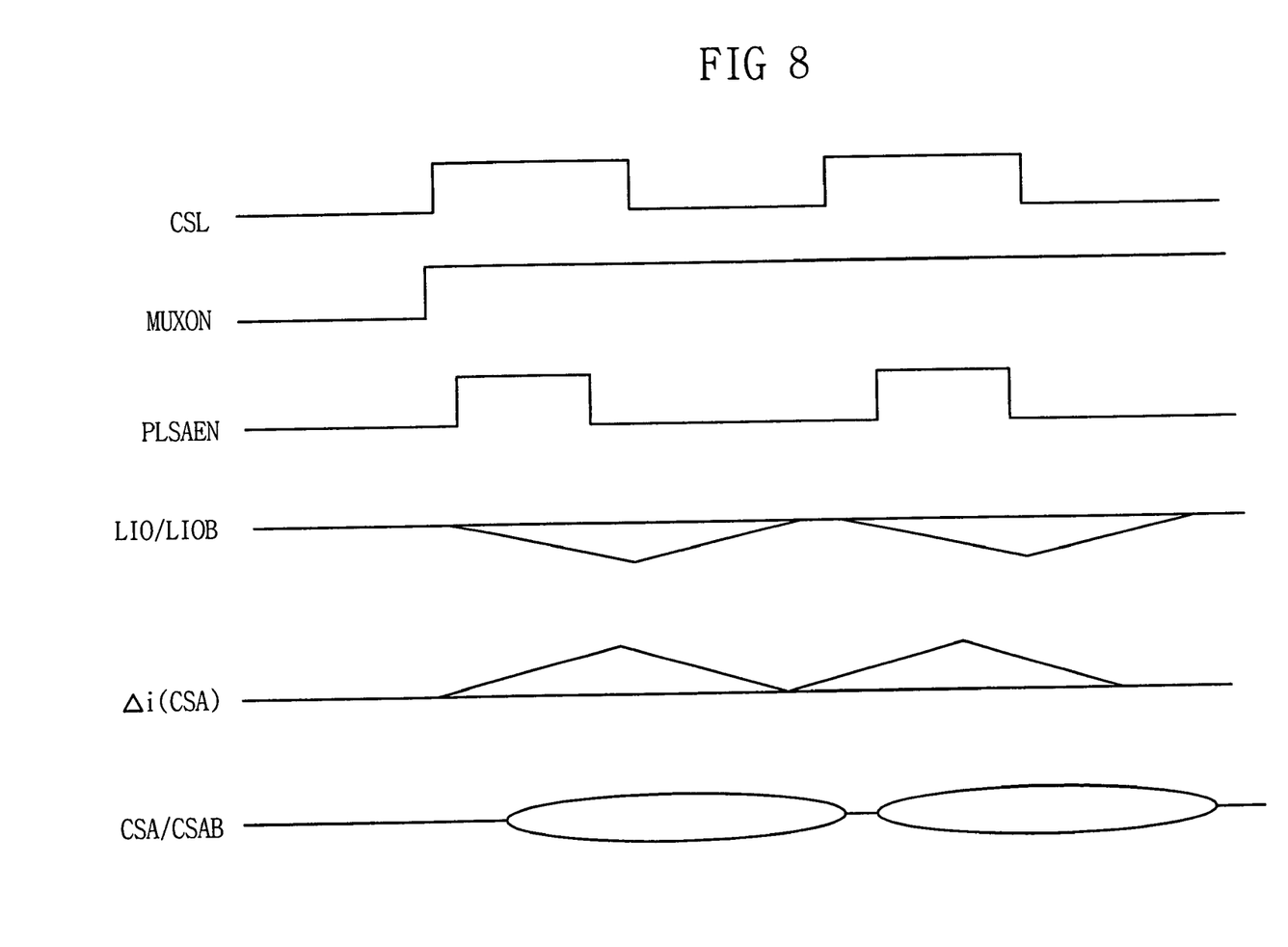

FIG. 7 is a circuit diagram of a sense amplifier circuit according to one embodiment of the invention and FIG. 8 is a timing diagram illustrating the operation of the sense amplifier circuit illustrated in FIG. 7.

Referring to FIG. 7, the sense amplifier circuit comprises bit line sense amplifier (BLSA) 200, current sense amplifier 300, and IO sense amplifier 110. For explanation purposes, current sense amplifier 300 will be referred to as a first IO sense amplifier 300 and IO sense amplifier 110 will be referred to as a second IO sense amplifier 110.

BLSA 200 comprises PMOS transistors P7 and P8 and NMOS transistors N9 and N10. PMOS transistor P7 and NMOS transistor N9 each have a first terminal connected to bitline BL, a gate connected to complementary bit line BLB, and a second terminal. PMOS transistor P8 and NMOS transistor N10 each have a first terminal connected to complementary bitline BLB, a gate connected to bit line BL, and a second terminal. The respective second terminals of PMOS transistor P7 and P8 are connected to each other and the respective second terminals of NMOS transistors N9 and N10 are connected to each other.

Bit line BL is connected to local data IO line LIO through NMOS transistor N3, and complementary bit line BLB is connected to complementary local data IO line LIOB through NMOS transistor N4. NMOS transistors N3 and N4 are both activated in response to the voltage level of a common select line CSL.

First IO sense amplifier 300 comprises PMOS transistors P5 and P6 and NMOS transistors N5 and N6. PMOS transistors P5 and P6 and NMOS transistors N5 and N6 each have first and second terminals and a gate. The gate of PMOS transistor P5 is connected to the second terminal of PMOS transistor P6 and the gate of PMOS transistor P6 is connected to the second terminal of PMOS transistor P5. The first terminals of NMOS transistors N5 and N6 are connected to the respective second terminals of PMOS transistors P5 and P6. The respective gates of NMOS transistors N5 and N6 are connected to the respective first terminals of NMOS transistors N5 and N6. The respective second terminals of NMOS transistors N5 and N6 are connected to ground. Output signals CSA and CSAB of first IO sense amplifier 300 are apparent at respective output nodes NO4 and NO5, which are connected to the respective first terminals of NMOS transistors N5 and N6.

Second IO sense amplifier 110 comprises NMOS transistors N1 and N2 and N11 through N15. NMOS transistor N1 is connected between complementary local data IO line LIOB and complementary global data IO line GIOB and is controlled by multiplexing signal MUXON. NMOS transistor N2 is connected between local data IO line LIO and global data IO line GIO and is also controlled by multiplexing signal MUXON. NMOS transistor N11 has a first terminal, a second terminal and a gate connected to local data IO line LO. NMOS transistor N12 has a first terminal, a second terminal, and a gate connected to complementary local data IO line LIOB. NMOS transistor N13 has a first terminal connected to complementary global data IO line GIOB, a second terminal connected to the first terminal of NMOS transistor N11, and a gate. NMOS transistor N14 has a first terminal connected to global data IO line GIO, a second terminal connected to the first terminal of NMOS transistor N12, and a gate connected to the gate of NMOS transistor N13. N15 has a first terminal connected to the respective second terminals of NMOS transistors N11 and N12, a second terminal connected to ground, and a gate connected to the respective gates of NMOS transistors N13 and N14. The respective gates of NMOS transistors N13 through N15 all receive sense amplifier control signal PLSAEN.

First IO sense amplifier 300 comprises a cross-coupled type differential amplifier and is used to sense a current difference between inputs apparent at input nodes NO1 and NO2 (connected to the respective first terminals of PMOS transistors P6 and P5), as described above in relation to FIGS. 1 and 2.

Second IO sense amplifier 110 is operationally connected between first complementary local data IO line LIOB and local data IO line LIO/LIOB and second data IO line pair GIO, GIOB in order to increase a current difference in the second data IO line pair GIO, GIOB when the sense amplifier control signal PLSAEN is activated.

The sense amplifier circuit of FIG. 7 further comprises a circuit 120 including PMOS transistor P1 connected between a power supply voltage and global data IO line GIO and PMOS transistor P2 connected between complementary global data IO line GIOB. PMOS transistors P1 and P2 are both gated by load control signal PLOADON.

The sense amplifier circuit of FIG. 7 further comprises a circuit 310 including PMOS transistors P3 and P4. PMOS transistor P3 is connected between global data IO line GIO and the first terminal of PMOS transistor P5. PMOS transistor P4 is connected between complementary global data IO line GIOB and the first terminal of PMOS transistor P6.

The sense amplifier circuit of FIG. 7 has a mixed-structure that includes various aspects of the local sense amplifier and the current sense amplifier of FIGS. 1 and 2. The sense amplifier circuit of FIG. 7 uses multiplexing signal MUXON to control respective connections between local data IO line LIO and global data IO line GIO and between complementary local data IO line LIOB and complementary global data IO line GIOB. As illustrated in FIG. 8, multiplexing signal MUXON is activated during a read operation performed by the sense amplifier circuit.

Precharge transistors P9 and P10 shown in FIG. 2 are omitted from the sense amplifier circuit of FIG. 7. The layout of precharge transistors P9 and P10 and wires of precharge signals are removed, and the control of multiplexing signal MUXON is changed, providing various advantages in terms of layout and signal control.

In the sense amplifier circuit of FIG. 7, where sense amplifier control signal PLSAEN is activated, local sense amplifier 110 is enabled. On the other hand, where sense amplifier control signal PLSAEN is deactivated, local sense amplifier 110 is disabled. As a result, the differential amplifier type local sense amplifier 110 may be used or not used by controlling sense amplifier control signal PLSAEN. In other words, a predetermined option or mode of the sense amplifier circuit may be used to determine whether local sense amplifier 110 operates or not.

Sense amplifier control signal PLSAEN may be generated based on the state of a fuse, the presence or absence of a metal layer, or the state of a mode register set (MRS) control signal. Based on the state of sense amplifier control signal PLSAEN, second IO sense amplifier 110 may be enabled or disabled.

FIG. 8 contains waveforms illustrating the timing of the sense amplifier circuit of FIG. 7 during a read operation. The read operation is described below with reference to FIG. 8.

In the read operation, column selection line CSL and multiplexing signal MUXON are activated. Sense amplifier control signal PLSAEN is also activated to enable local sense amplifier 110. As a result, local data IO line LIO is connected with global data IO line GIO and complementary local data IO line LIOB is connected with complementary global data IO line GIOB. Under these conditions, local sense amplifier 110 performs a sensing and amplifying operation. In other words, NMOS transistors N1 and N2 are turned on without a precharge operation, and sense amplifier 110 performs a voltage differential amplifying operation on local data IO line LIO and complementary local data IO line LIOB. The voltage difference between local data IO line LIO and complementary local data IO line LIOB is illustrated by the waveform labeled LIO/LIOB in FIG. 8. As illustrated by the waveforms in FIG. 8, the level of the voltage difference between local data IO line LIO and complementary local data IO line LIOB is relatively small compared with the level of the voltage difference between local data IO line LIO and complementary local data IO line LIOB in the waveforms of FIG. 6. As a result, the level of the voltage difference between global data IO line GIO and complementary global data IO line GIOB in FIG. 8 will also be relatively small.

In the read operation using the sensing amplifier circuit of FIG. 7, load transistors P1 and P2 function as precharge transistors for local data IO line LIO and complementary local data IO line LIOB, respectively. Current sense amplifier 300 of FIG. 7 is able to develop current sense data CSA and CSAB more efficiently than current sense amplifier 300 in FIG. 2. Accordingly, the sense amplifier circuit of FIG. 7 is better suited for high frequency operation than the sense amplifier circuit of FIG. 2. In addition, the sense amplifier circuit of FIG. 7 has a simpler layout and control functionality than the sense amplifier circuit of FIG. 7.

Further, by deactivating sense amplifier control signal PLSAEN, local sense amplifier 110 can be disabled so that the sense amplifier circuit of FIG. 7 performs a read operation similar to the sense amplifier circuit of FIG. 1. In other words, the sense amplifier circuit of FIG. 7 can operate in different modes. The different modes can be determined, for example, using a MRS control signal or a fuse.

As described above, in a semiconductor memory device according to selected embodiments of the invention, the reliability of a high speed data read operation may be improved without increasing a chip size. In addition, a second IO sense amplifier may be selectively driven according to a predetermined option.

The foregoing exemplary embodiments are teaching examples. Those of ordinary skill in the art will understand that various changes in form and details may be made to the exemplary embodiments without departing from the scope of the invention as defined by the claims.

What is claimed:

1. A semiconductor memory device, comprising:
   a bit line sense amplifier connected to a bit line and a complementary bit line;
   a first input/output (IO) line connected to the bit line via a first column select circuit and a first complementary IO line connected to the complementary bit line via a second column select circuit;
   a second IO line connected to the first IO line via a first switching circuit and a second complementary IO line connected to the first complementary IO line via a second switching circuit;
   a first IO sense amplifier connected to the second IO line and the second complementary IO line;
   a second IO sense amplifier connected between the first IO line and the second IO line and between the first complementary IO line and the second complementary IO line and adapted to operate in response to a sense amplifier control signal;
   wherein the second IO sense amplifier operates to amplify a difference between a voltage apparent on the first IO line and a voltage apparent on the first complementary IO line while the first and second switching circuits are turned on such that a difference between a current in the second IO line and a current in the second complementary IO line is amplified.

2. The device of claim 1, wherein the second IO sense amplifier comprises:
   a first negative metal-oxide semiconductor (NMOS) transistor having a first terminal, a second terminal, and a gate connected to the first IO line;
   a second NMOS transistor having a first terminal, a second terminal connected to the second terminal of the first NMOS transistor, and a gate connected to the complementary first IO line;
   a third NMOS transistor having a first terminal connected to the second complementary IO line, a second terminal connected to the first terminal of the first NMOS transistor, and a gate receiving the sense amplifier control signal;

a fourth NMOS transistor having a first terminal connected to the second IO line, a second terminal connected to the first terminal of the second NMOS transistor, and a gate receiving the sense amplifier control signal;

a fifth NMOS transistor having a first terminal connected to the respective second terminals of the first and second NMOS transistors, a second terminal connected to ground, and a gate receiving the sense amplifier control signal.

3. The device of claim 2, wherein a logic state of the sense amplifier control signal is determined in relation to a state of a fuse.

4. The device of claim 2, wherein a logic state of the sense amplifier control signal is determined by a presence or absence of a metal interconnection in the semiconductor memory device.

5. The device of claim 2, wherein a logic state of the sense amplifier control signal is determined by a mode register set (MRS) control signal.

6. The device of claim 2, wherein the first IO sense amplifier is a cross-coupled differential amplifier type sense amplifier adapted to amplify a difference between a current in the first IO line and the first complementary IO line.

7. The device of claim 1, wherein the first and second IO sense amplifiers are current sensing type sense amplifiers and the device further comprises:

a voltage sensing type sense amplifier connected to the second IO sense amplifier.

8. A semiconductor memory device, comprising:

a bit line sense amplifier connected between a bit line and a complementary bit line;

a current sensing type input/output (IO) sense amplifier connected to a global data IO line and a complementary global data IO line;

a local sense amplifier connected between the bit line sense amplifier and the current sensing type IO sense amplifier through a local data IO line and a complementary local data IO line, wherein the local data IO line is connected at one end to the bit line and at another end to the global data IO line through a first switching circuit, and the complementary local data IO line is connected at one end to the complementary bit line and at another end to the complementary global data IO line through a second switching circuit; and an option unit adapted to selectively enable the local sense amplifier while the first and second switching circuits are turned on such that the local sense amplifier amplifies a difference between a current in the local data IO line and a current in the complementary IO line.

9. The device of claim 8, wherein the option unit enables the local sense amplifier in relation to a state of a fuse.

10. The device of claim 8, wherein the option unit enables the local sense amplifier using a metal structure formed in the device.

11. The device of claim 8, wherein the option unit enables the local sense amplifier in relation to a logic state of a mode register set (MRS) control signal.

12. The device of claim 8, wherein the option unit enables the local sense amplifier in relation to a logic state of an extended mode register set (MRS) control signal.

13. The device of claim 8, wherein the first and second switching circuits are turned on during a read operation and turned off upon completion of the read operation.

14. A method of controlling a semiconductor device comprising a bit line sense amplifier connected between a bit line and a complementary bit line, a current sensing type input/output (IO) sense amplifier connected to a global data IO line and a complementary global data IO line, and a local sense amplifier connected between the bit line sense amplifier and the current sensing type IO sense amplifier through a local data IO line and a complementary local data IO line, wherein the local data IO line is connected at one end to the bit line and at another end to the global data IO line through a first switching circuit, and the complementary local data IO line is connected at one end to the complementary bit line and at another end to the complementary global data IO line through a second switching circuit, the method comprising:

operationally connecting the local data IO line to the global data IO line and the complementary local data IO line to the complementary global data IO line during a read operation by turning on the first and second switching circuits; and selectively enabling the local sense amplifier.

15. The method of claim 14, wherein the local sense amplifier is enabled in response to a state of a fuse.

16. The method of claim 14, wherein the local sense amplifier is enabled using a metal structure formed in the device.

17. The method of claim 14, wherein the local sense amplifier is enabled based on a logic state of a mode register set (MRS) control signal.

18. The method of claim 14, wherein each of the first and second switching circuits comprises a negative metal-oxide semiconductor (NMOS) transistor.

19. The method of claim 14, further comprising:

activating a column selection line and a multiplexing signal; and activating a sense amplifier control signal to enable the local sense amplifier without performing a precharge operation in relation to the local data IO line and the complementary local data IO line.

* * * * *